United States Patent
Bisbing et al.

(10) Patent No.: US 9,283,947 B2
(45) Date of Patent: Mar. 15, 2016

(54) SYSTEM AND METHOD FOR DETERMINING BATTERY CAPACITY IN AN ELECTRIC VEHICLE

(75) Inventors: Joseph Bisbing, White Lake, MI (US); Daniel P. Grenn, Highland, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 784 days.

(21) Appl. No.: 13/084,415

(22) Filed: Apr. 11, 2011

(65) Prior Publication Data

US 2012/0256594 A1 Oct. 11, 2012

(51) Int. Cl.
| | |
|---|---|
| *G01N 27/416* | (2006.01) |
| *B60W 10/08* | (2006.01) |
| *B60L 11/18* | (2006.01) |
| *G01R 31/36* | (2006.01) |
| *B60W 10/30* | (2006.01) |
| *B60W 20/00* | (2006.01) |
| *H01M 10/44* | (2006.01) |

(52) U.S. Cl.
CPC ............ *B60W 10/08* (2013.01); *B60L 11/1857* (2013.01); *B60L 11/1862* (2013.01); *B60W 10/30* (2013.01); *G01R 31/3679* (2013.01); *B60W 20/50* (2013.01); *B60W 2510/242* (2013.01); *B60W 2710/244* (2013.01); *H01M 10/44* (2013.01); *H01M 2200/20* (2013.01); *Y02T 10/705* (2013.01); *Y02T 10/7005* (2013.01); *Y02T 10/7044* (2013.01)

(58) Field of Classification Search
CPC .......................... G01R 31/3679; B60L 11/1857
USPC ................................................ 324/426, 427
See application file for complete search history.

(56) References Cited

U.S. PATENT DOCUMENTS

| | | | |
|---|---|---|---|
| 4,937,528 A | 6/1990 | Palanisamy | |
| 5,281,919 A | * 1/1994 | Palanisamy | .................... 324/427 |

(Continued)

FOREIGN PATENT DOCUMENTS

| | | |
|---|---|---|
| CN | 101320079 A | 12/2008 |
| CN | 201765313 U | 3/2011 |
| CN | 102736032 A | 10/2012 |

OTHER PUBLICATIONS

State Intellectual Property Office of the Peoples' Republic of China, Office Action for Chinese Patent Application No. 201210104005.X, mailed Jan. 17, 2014.

*Primary Examiner* — Yalkew Fantu
*Assistant Examiner* — Manuel Hernandez
(74) *Attorney, Agent, or Firm* — Ingrassia Fisher & Lorenz, P.C.

(57) ABSTRACT

In accordance with exemplary embodiments, battery capacity of an electric vehicle can be automatically determined. In an exemplary method, an instruction is received to determine a battery capacity value and one or more vehicle accessories are activated to discharge the battery to a first charge level. When the first charge level is reached, a generator in the vehicle is started and used to charge the battery to a second charge level, after which the battery capacity value can be determined and stored. In accordance with the exemplary embodiments, the vehicle comprises a controller adapted to cause a battery to be discharged and charged to determine a capacity value of the battery. A plurality of accessories are configured to activate and deactivate responsive to the controller to discharge the battery, while a generator is responsive to the controller to charge the battery so that the controller can determine the battery capacity value.

2 Claims, 5 Drawing Sheets

(56) References Cited

U.S. PATENT DOCUMENTS

| | | | |
|---|---|---|---|
| 5,479,085 A * | 12/1995 | Honda et al. | 320/134 |
| 6,239,579 B1 * | 5/2001 | Dunn et al. | 320/121 |
| 6,286,254 B1 * | 9/2001 | Obonai et al. | 47/63 |
| 6,356,083 B1 | 3/2002 | Ying | |
| 6,501,250 B2 | 12/2002 | Bito et al. | |
| 6,621,250 B1 * | 9/2003 | Ohkubo et al. | 320/136 |
| 7,554,297 B2 | 6/2009 | Sada et al. | |
| 7,649,338 B2 | 1/2010 | Seo et al. | |
| 7,679,329 B2 | 3/2010 | Lim et al. | |
| 7,899,631 B2 * | 3/2011 | Iwane | 702/63 |
| 2003/0184307 A1 | 10/2003 | Kozlowski et al. | |
| 2008/0054848 A1 | 3/2008 | Yun et al. | |
| 2009/0037124 A1 | 2/2009 | Majima | |
| 2009/0322283 A1 | 12/2009 | Zhang et al. | |
| 2010/0019727 A1 | 1/2010 | Karden et al. | |
| 2010/0117657 A1 * | 5/2010 | Ahmed et al. | 324/427 |
| 2012/0176092 A1 * | 7/2012 | Fujii et al. | 320/134 |

\* cited by examiner

SYSTEM AND METHOD FOR DETERMINING BATTERY CAPACITY IN AN ELECTRIC VEHICLE

TECHNICAL FIELD

The subject matter described in this application generally relates to systems and methodologies for charging electric vehicles or hybrid electric vehicles, and more particularly, to systems and methodologies for determining battery capacity in electric vehicles or hybrid electric vehicles.

BACKGROUND

Electric and hybrid electric vehicles are becoming increasingly popular. These vehicles include onboard energy storage systems (e.g., battery packs) that are recharged from a power source, such as a utility power source, by connecting (plugging in) the vehicle to an outlet. A vehicle's electric power supply system must support a plurality of vehicle functions that operate on electric energy. Such functions include normal vehicle operation devices and safety related devices such as window or mirror defoggers, anti-lock brake systems, traction or stability systems, lighting systems, etc. In addition to these devices, the vehicle's electric power supply system supports comfort, convenience, and entertainment devices. Some examples include air conditioning, heated seats, video/audio systems, and power outlet ports for user devices.

The increasing use of the electrical devices and accessories as described above directly affects the drain on the vehicle battery, and hence, the battery's useful life. The acceleration of battery aging has a direct correlation with the frequency of use of such devices, which uses the vehicle battery as a power source. Since the effective driving range of electric vehicles and hybrid electric vehicles depends upon the charge sustaining property of the vehicle battery (that is, the battery capacity), accurate and robust capacity estimation is needed for reliable and safe operation of electric and hybrid electric vehicles as well as for optimum power management systems for such vehicles.

A conventional method used to determine battery capacity is to use a time-consuming full discharging and re-charging process in a vehicle service center environment. Typically, this protracted process can take up to thirteen hours, during which time the vehicle owner is without use of the vehicle. Accordingly, it is desirable to provide a reliable and expedient battery charge capacity determination (or learning) process. Additionally, other desirable features and characteristics of the present invention will become apparent from the subsequent description taken in conjunction with the accompanying drawings and the foregoing technical field and background.

BRIEF SUMMARY

In accordance with an exemplary embodiment, a system is provided for determining battery capacity in an electric vehicle. The system comprises a controller adapted to cause a battery to be discharged and charged to determine a capacity value of the battery. A plurality of accessories are configured to activate and deactivate responsive to the controller to discharge the battery, while a generator is responsive to the controller to charge the battery so that the controller can determine the battery capacity value.

In accordance with an exemplary embodiment, a method is provided for determining battery capacity in an electric vehicle. The method comprises receiving an instruction to determine a battery capacity value of a battery of a vehicle and activating one or more vehicle accessories to discharge the battery to a first charge level. When the first charge level is reached, a generator in the vehicle is started and used to charge the battery to a second charge level, after which the battery capacity value can be determined and stored.

DESCRIPTION OF THE DRAWINGS

The inventive subject matter will hereinafter be described in conjunction with the following drawing figures, wherein like numerals denote like elements, and wherein.

DETAILED DESCRIPTION

The following detailed description is merely exemplary in nature and is not intended to limit the inventive subject matter or the application and uses of the inventive subject matter. Furthermore, there is no intention to be bound by any expressed or implied theory presented in the preceding technical field, background, brief summary or the following detailed description.

Figure 1:
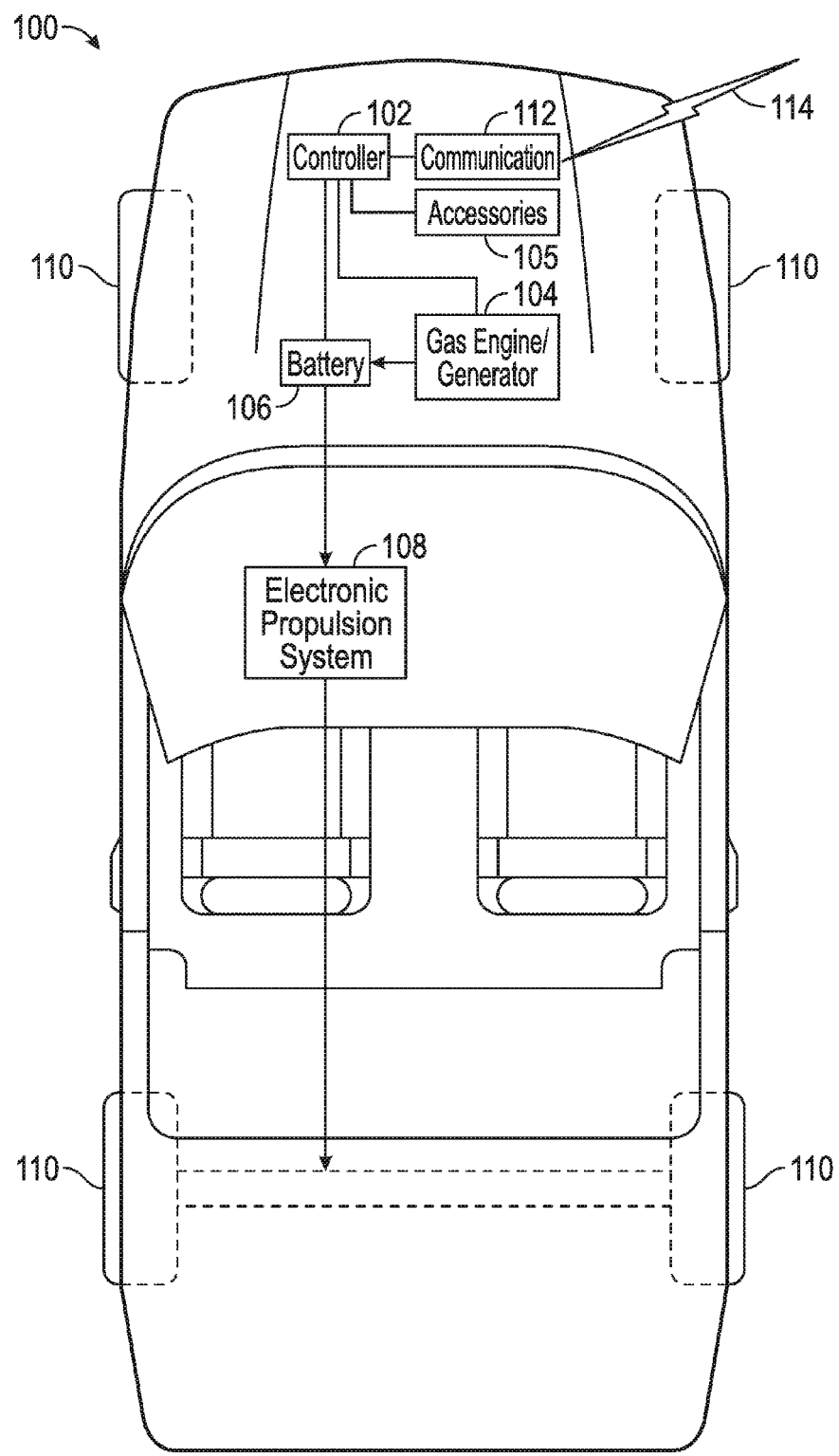
FIG. 1 is an illustration of an automobile according to an exemplary embodiment.

FIG. 1 is a simplified schematic representation of an embodiment of a vehicle 100 according to the present disclosure. Although vehicle 100 is illustrated as a purely electric vehicle, the techniques and concepts described herein are also applicable to hybrid electric vehicles. The illustrated embodiment of vehicle 100 includes, without limitation: a vehicle control module 102 coupled to an onboard generator 104; an onboard energy storage system 106; an electric propulsion system 108 driving wheels 110; and an onboard data communication system 112 for providing bi-directional communication 114, which in one embodiment may comprise an OnStar® compatible communication system.

The vehicle control module 102, may include any type of processing element or vehicle controller, and may be equipped with nonvolatile memory, random access memory (RAM), discrete and analog input/output (I/O), a central processing unit, and/or communications interfaces for networking within a vehicular communications network. In an electric vehicle embodiment, onboard generator 104 may comprise a small gas (or other liquid fuel) powered generator sufficient to charge the energy storage system 106 if needed. In a hybrid electric vehicle embodiment, generator 104 may be powered by or part of the vehicle gas (or other fuel) engine used to propel the vehicle. Onboard energy storage system 106 may be realized as a rechargeable battery pack having a single battery module or any number of individual battery modules. Onboard energy storage system 106 provides electrical energy that enables electric propulsion system 108 to provide traction power to wheels 110.

While FIG. 1 is a schematic diagram that depicts various electrical and mechanical connections and couplings in a very simplified manner for ease of description, an actual embodiment of vehicle 100 will of course utilize additional physical components and devices that are well known in the automotive industry. For example, numerous conventional accessories 105 would be included in a commercially available vehicle such as window or mirror defoggers, anti-lock brake systems, traction or stability systems, lighting systems, warning systems (e.g., horn), turn indicators (signals), air conditioning, heated seats, video/audio systems, and power outlet ports for user devices (collectively, accessories). Also, the vehicle 100 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The vehicle 100 may also incorporate any one of, or combination of, a number of different types of engines, such as, for example, a gasoline or diesel fueled combustion engine, a flex fuel vehicle (FFV) engine (i.e., an engine that uses a mixture of gasoline and alcohol) or a gaseous compound (e.g., hydrogen and/or natural gas) fueled engine.

Since the vehicle's energy storage system 106 (e.g., batteries) must support both propulsion and the operation of a plurality of vehicle accessories, it is important that the vehicle controller 102 know the charge capacity of the energy storage system 106. That is, the vehicle controller 102 uses charge capacity value (known as the battery capacity) for the efficient, reliable and safe operation of the vehicle. Conventionally, determining (or learning) the battery capacity is a laborious process involving a technician of a vehicle service center discharging the battery to a low (first) charge level, such as by driving the vehicle to cause depletion of the battery charge. This practice is both time consuming and is not without risk of injury or vehicle damage should another diver collide with the service technician while she/he is driving the vehicle to reduce the battery charge level. After the battery has been sufficiently discharged, the technician must recharge the battery by connecting (plugging in) the vehicle to an energy source (such as a power grid) and waiting for the batteries to be charged to a high (second) charge level so that battery capacity can be determined (learned). It is not uncommon for this process to take up to thirteen hours to complete, during which, the owner of the vehicle is without use of the vehicle until it is ready to be restored to service.

According to embodiments of the present disclosure, the battery capacity learn process is partially or entirely automated and performed in an expedited manner when compared to conventional practice. In a fully automated embodiment, a technician transmits a message to the controller 102 that comprises an instruction to determine the battery capacity value and may include data such as the low (first) battery charge level and the high (second) battery charge level to be used to determine the battery capacity value. This message may be sent to the controller 102 by a direct (wired) connection or wirelessly by use of communication system 112. The controller 102 operates to automatically activate (turn on) one or more accessories to deplete battery charge thereby discharging the battery to the low (first) level. In some embodiments, the controller 102 activates predetermined accessories to discharge the batteries. In other embodiments, the controller activates selected accessories to more expeditiously discharge the batteries. For example, activating the heating system in cold months and air conditioning in warm months. After reaching the low charge level, the accessories can be deactivated and the generator 104 is activated to charge the batteries of the energy storage system 106. As will discussed further below, the onboard generator 104 can recharge the batteries much more rapidly than connecting the vehicle to a standard 110 volt power grid, or even a 220 volt power source. After charging the battery to the high level, the battery capacity value can be determined using one of several known algorithms that vary depending upon battery chemistry and knowledge of how the battery type stores and releases energy. Once determined, the battery capacity value is stored in the controller 102 and used for the operation of the vehicle. Since this process is entirely automated, a technician can initiate the battery capacity learn process with the vehicle in the parking lot of the service center and not have the vehicle occupy a service bay or require the attention of the service technician until the battery capacity learn process has automatically completed. The fully automated embodiments of the present disclosure thus provide a more rapid battery capacity learn process, while freeing the technician to serve other customers and to not risk operating the vehicle to discharge the batteries.

In a semi-automated embodiment, the technician can more rapid discharge the batteries by operating (driving) the vehicle until the generator automatically starts and begins the charging process. Thus, in the semi-automated embodiments of the present disclosure, the overall time battery capacity learn period may be reduced (and thus, return the vehicle to its owner sooner) at the expense of the technician's time to operate the vehicle to more rapidly discharge the batteries.

Figure 2:
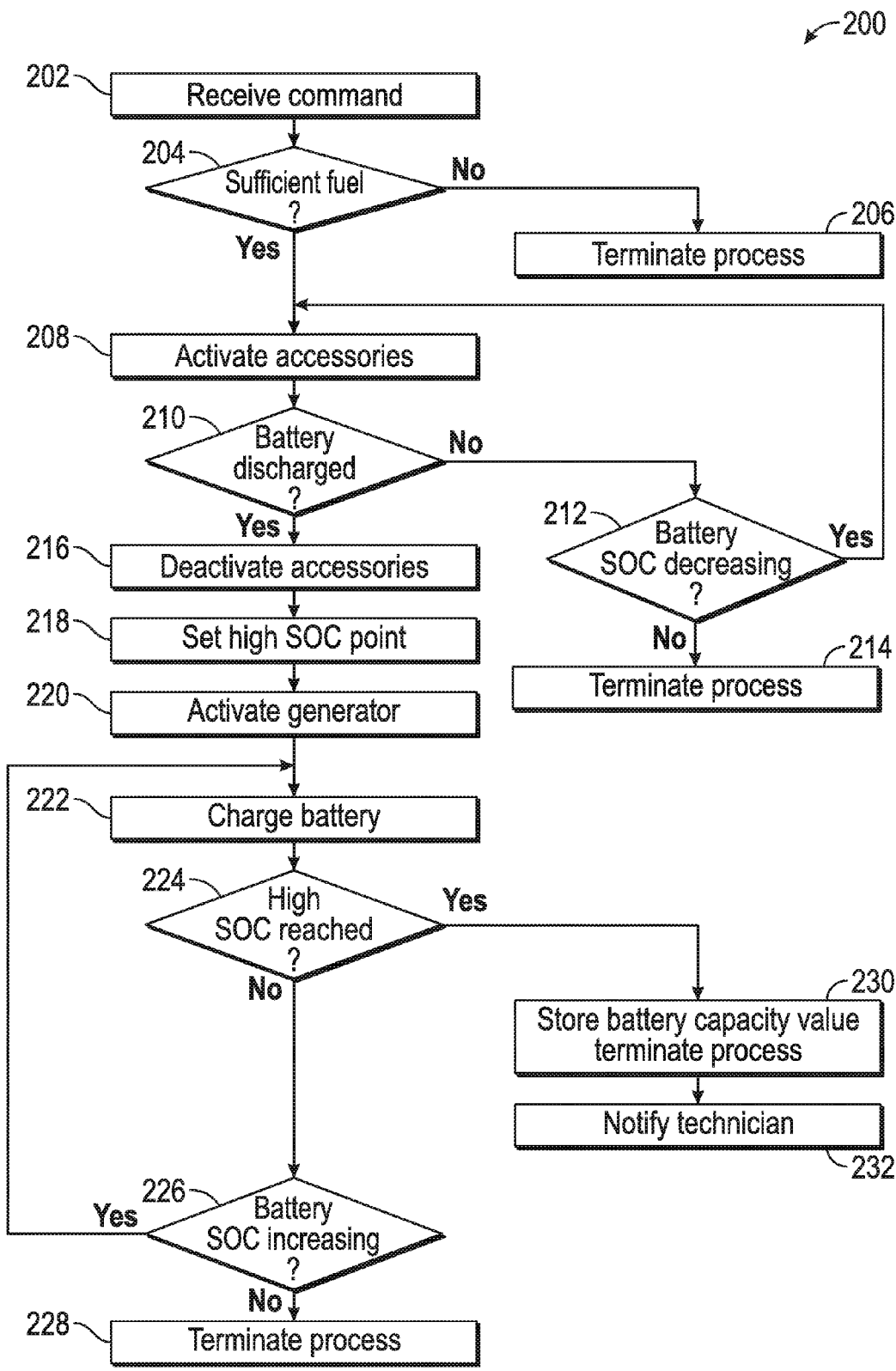
FIG. 2 is flow diagram of a method in accordance with an exemplary embodiment.

FIG. 2 is a flow diagram of an exemplary method or algorithm 200 in accordance with the present disclosures. The steps of the method or algorithm 200 described herein may be embodied directly in hardware, in firmware, in a software module executed by controller 102 or other processor, or in any practical combination thereof. A software module may reside in RAM memory, flash memory, ROM memory, EPROM memory, EEPROM memory, registers, a hard disk, a removable disk, a CD-ROM, or any other form of storage medium known in the art.

The method begins (202) by the controller (102 of FIG. 1) receiving a command to begin the battery capacity learn (determination) process. Generally, the command will include an instruction commonly referred to as a control parameter identifier (CPID) that may include a low (first) battery state-of-charge (SOC) setting (used for the discharge phase) and the high (second) battery SOC setting (used for the charge phase). Since the various embodiments of the present disclosure utilize the onboard generator for the charging phase of the battery capacity learn process, decision 204 determines whether the vehicle contains sufficient fuel to run the generator (or engine) for a sufficient time to complete the battery capacity learn process. In some embodiments, decision 204 also determines whether there are any vehicle malfunctions that would prevent successful completion of the battery capacity learn process. If there is a malfunction or insufficient fuel, the routine proceeds to step 206 where the CPID is rejected and the battery capacity learn process terminated. Additionally, the technician is signaled or contacted to alert her/him to the problem. In one embodiment, a signal is provided such as periodically illuminating (blinking) the turn indicators (signals) or flashing the headlights. In other embodiments, the technician is contacted with a message from the vehicle communication system (112 of FIG. 1), which may be a text message or call to her/his cellular telephone or the telephone of the vehicle service center receptionist. In these embodiments, the command would include a message address (e.g., email address or telephone number) for the vehicle communication system (for example, OnStar®) to contact.

If there are no impediments to proceeding with the battery capacity determination (learn) process, the routine proceeds to step where the battery discharge process begins. In the fully automated embodiments of the present disclosure, the controller (102 of FIG. 1) would automatically activate (turn on) one or more accessories, such as, for example, the heating, ventilation and air-conditioning (HVAC) system, head lights or interior lights to discharge the battery. In the semi-automated embodiments, the technician could drive the vehicle to accelerate the battery discharge phase of the battery capacity learn process. Decision 210 determines whether the battery has been discharged to the low (first) state-of-charge point that may be provided with the command in step 202. If not, decision 212 determines whether the battery SOC is decreasing toward the target SOC setting (which is expected). If so, the battery discharge phase continues (loop to step 208), however, if the battery SOC is not decreasing, some error has occurred and the technician is notified (similar to that discussed for step 206) and the battery capacity learn process is terminated (step 214).

When decision 210 determines that the battery SOC has reached the low (first) charge level, the accessories are automatically deactivated (turned off) in step 216 to not impede (slow) the charging phase. In step 218, the controller (102 of FIG. 1) sets the second (high) SOC point and starts (activates or turns on) the generator (step 220), which in some embodiments comprises a gas-powered engine, to charge the battery (step 222). Next, decision 224 determines whether the battery charge level (SOC) has reached the high (second) setting. If not, decision 226 determines whether the battery SOC is increasing toward the high target SOC (which is expected). If so, the battery charge phase continues (loop to step 222), however, if the battery SOC is not increasing, some error has occurred and the technician is notified (similar to that discussed for step 206) and the battery capacity learn process is terminated (step 228). When decision 224 determines that the battery charge level (SOC) has reached the high (second) setting, the controller (102 of FIG. 1) determines the battery capacity value (using one of several known algorithms that vary depending upon battery chemistry and knowledge of how the battery type stores and releases energy), stores the battery capacity value, resets the operating battery SOC for normal vehicle operation, and terminates the battery capacity learn process (step 230). Finally, the technician is notified (step 232) by the vehicle providing a signal or transmitting a message.

Figure 3:
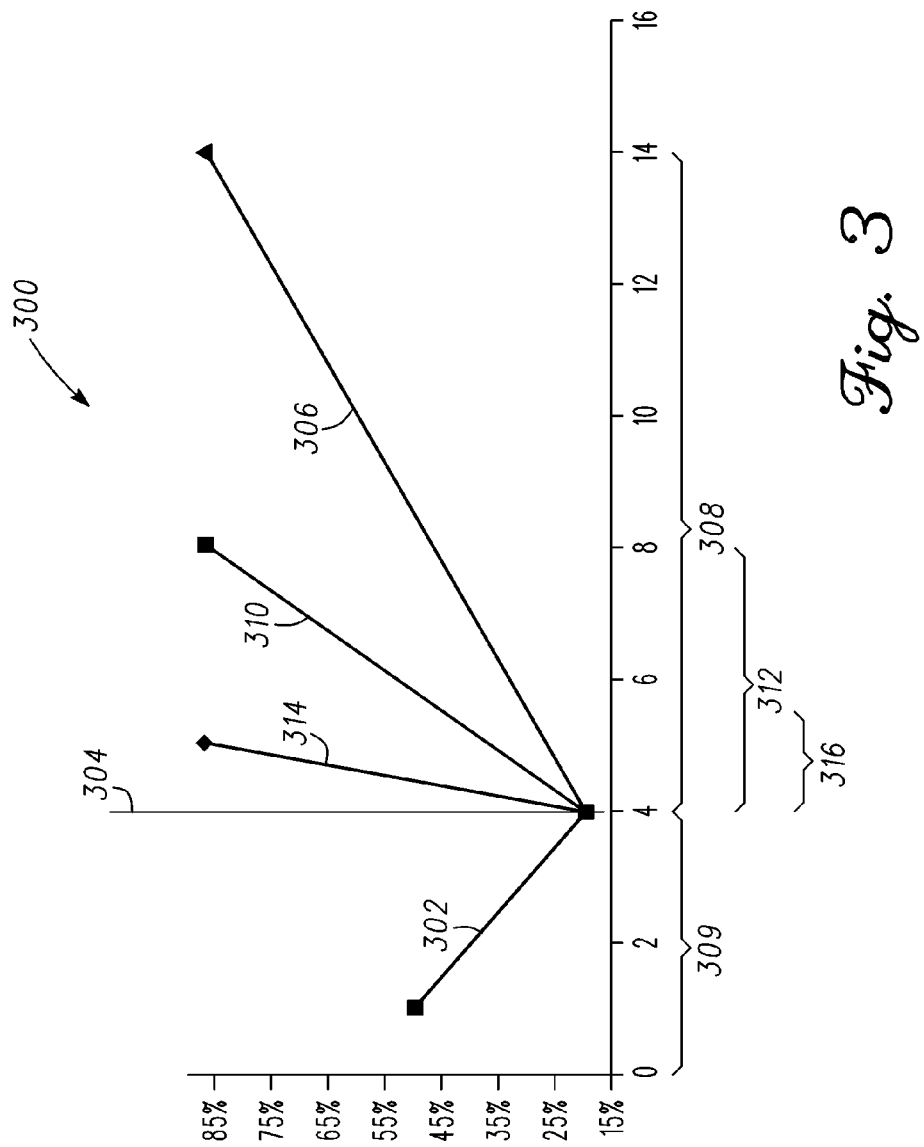
FIG. 3 is a chart illustrating one advantage of the present disclosure.
Figure 4:
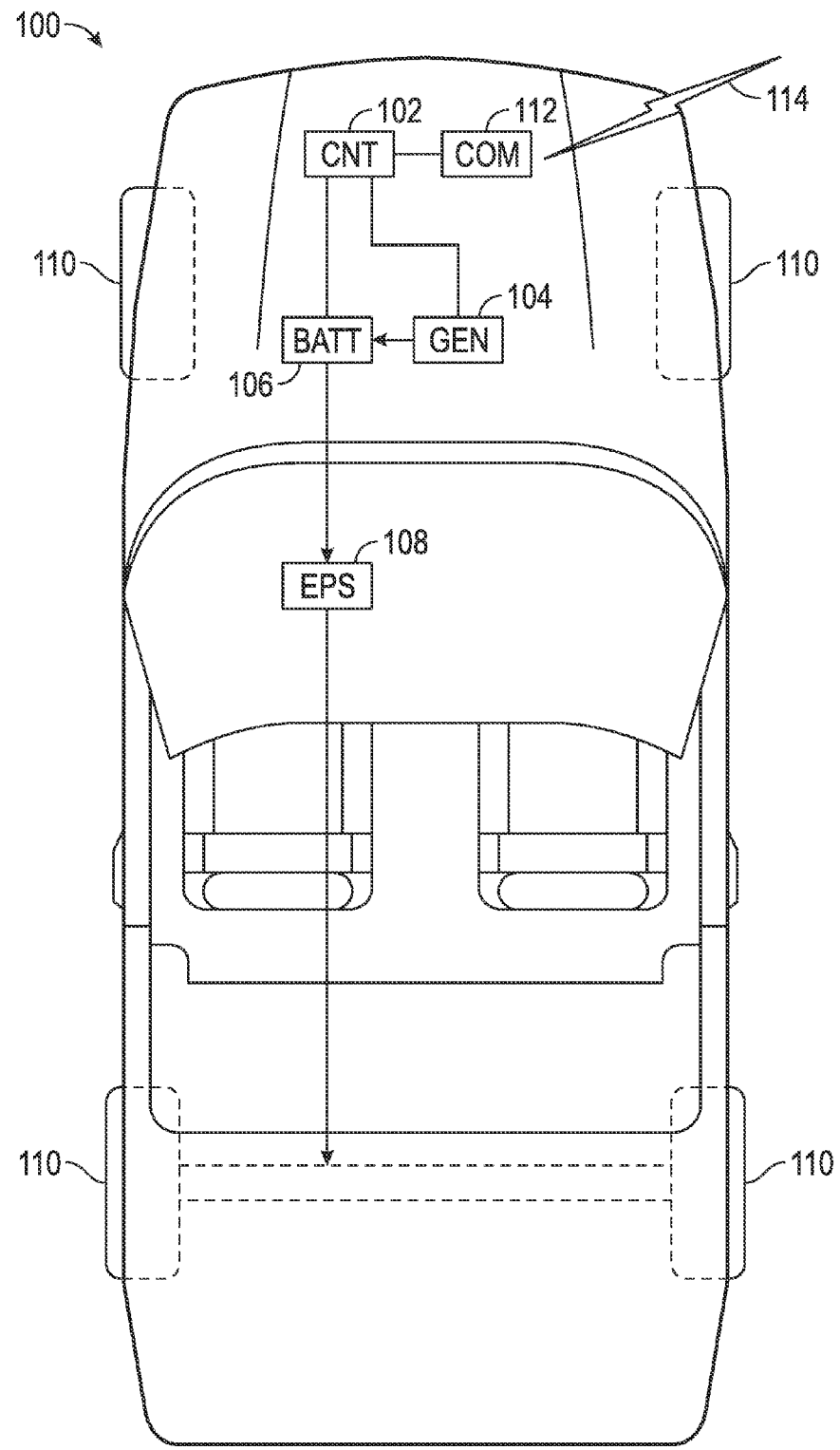
Figure 5:
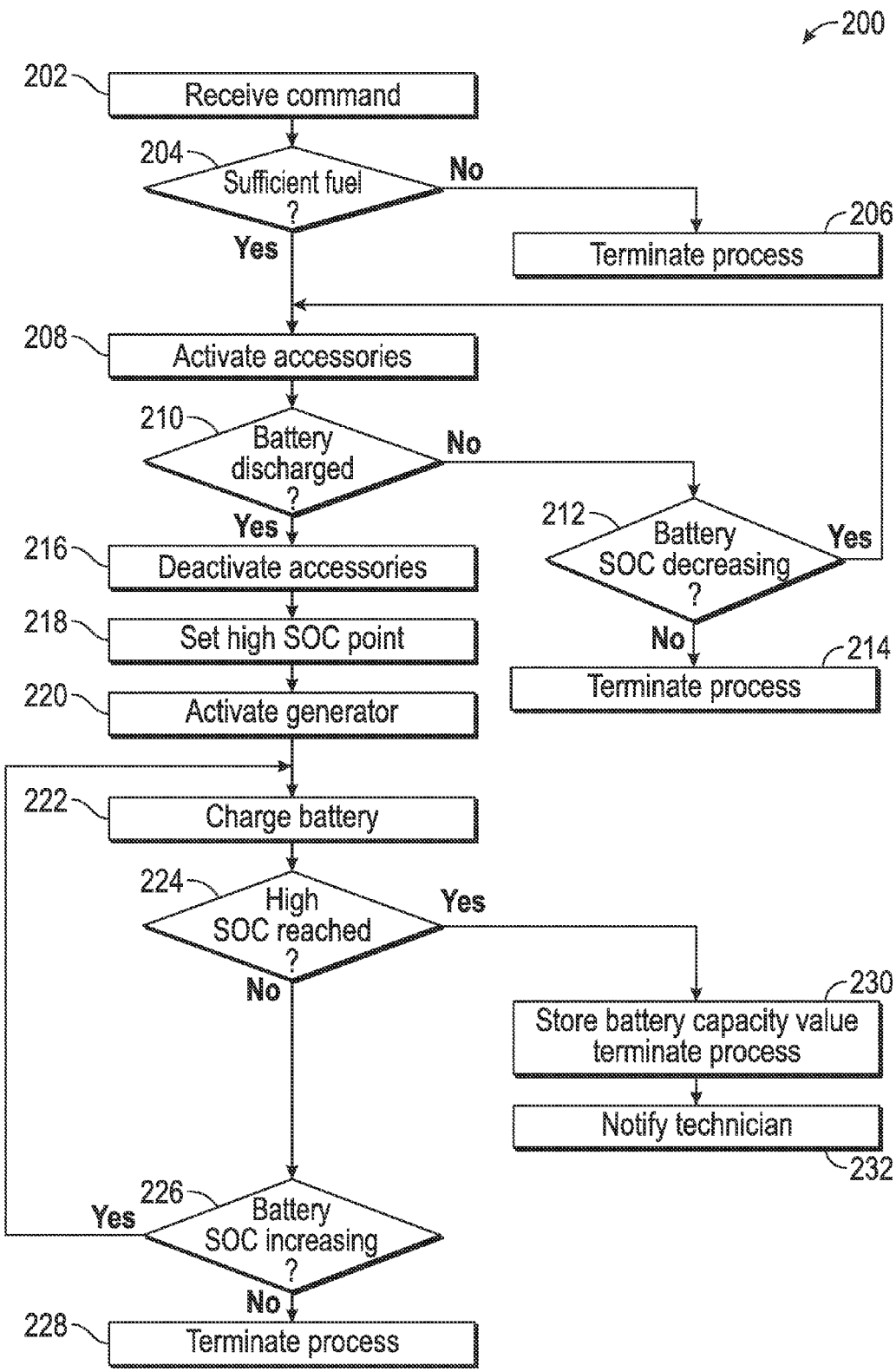

Referring to FIG. 3, a chart 300 illustrates one advantage of the present disclosure for the automated (or semi-automated) battery capacity learn process. The chart 300 displays time (in hours) along the horizontal axis and the battery SOC (in percent) along the vertical axis. The discharge phase (302) of the battery capacity learn process is displayed to the left of reference line 304, and various charging methods appear to the right of reference line 304. In the illustrated example, the low (first) battery SOC point was set to 20% and the high (second) battery SOC is set to 85%. In conventional battery capacity learn procedures, the vehicle would be connected (plugged in) to a standard 110 volt outlet which would charge the battery as shown by line 306. The time (308) expected to charge the battery is approximately ten hours. Add this time to the discharge time (309) and the overall process will take approximately thirteen hours. Battery charge time can be reduced in the conventional process if the vehicle service center as a 220 volt connection available, which would charge the batteries as shown by line 310. The time (312) for this procedure would be about four hours (or about seven hours overall adding discharge time 309). However, according to the multitude of embodiments of the present disclosure, the onboard generator (104 of FIG. 1) can charge the battery (314) in about one hour (316) making the overall battery capacity learn process (adding discharge time 309) about four hours. This facilitates completion of the battery capacity learn process in the same day as a customer provides the vehicle to the vehicle service center, allowing the vehicle to return to service much sooner than with the conventional process. Moreover, the technician can be freed to work on the vehicles of other customers providing better customer service to more customers.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the inventive subject matter in any way. Rather, the foregoing detailed description will provide those skilled in the art with a convenient road map for implementing the exemplary embodiment or exemplary embodiments. It should be understood that various changes can be made in the function and arrangement of elements without departing from the scope of the inventive subject matter as set forth in the appended claims and the legal equivalents thereof.

What is claimed is:

1. A hybrid-electric vehicle, comprising:
   an electric propulsion system for propelling the vehicle;
   and a gas powered engine/generator for propelling the vehicle;
   a controller adapted to cause a battery to be discharged and charged to determine a capacity value of the battery in response to receiving an instruction while the vehicle is parked;
   a plurality of accessories coupled to the controller and configured to activate to discharge the battery to a first charge level and then deactivate responsive to the controller; and
   the gas engine/generator being responsive to the controller to charge the battery after the first charge level is reached;
   wherein the controller determines and stores the capacity value of the battery.

2. The vehicle of claim 1, which includes a transmitter for transmitting a message upon determination of the capacity value of the battery.

\* \* \* \* \*